United States Patent
Ben-Chorin et al.

(10) Patent No.: US 6,895,862 B1
(45) Date of Patent: May 24, 2005

(54) DIGITAL OFFSET PRINTING REGISTRATION

(75) Inventors: Moshe Ben-Chorin, Rehovot (IL); Ilan Ben-David, Rosh Ha'ayin (IL)

(73) Assignee: A.I.T. Israel - Advanced Imaging Technology Ltd., Tel Aviv (IL)

( * ) Notice: Subject to any disclaimer, the term of this patent is extended or adjusted under 35 U.S.C. 154(b) by 0 days.

(21) Appl. No.: 10/089,725

(22) PCT Filed: Oct. 4, 2000

(86) PCT No.: PCT/IL00/00620
§ 371 (c)(1),
(2), (4) Date: Feb. 21, 2003

(87) PCT Pub. No.: WO01/25012
PCT Pub. Date: Apr. 12, 2001

Related U.S. Application Data

(60) Provisional application No. 60/157,856, filed on Oct. 6, 1999.

(51) Int. Cl.[7] .............................. B41F 1/34; B41F 1/66; B41F 13/24
(52) U.S. Cl. ..................... 101/485; 101/484; 101/181
(58) Field of Search ............................ 101/485, 212, 101/483, 484, 248, 492; 358/1.15; 399/40

(56) References Cited

U.S. PATENT DOCUMENTS

| | | | | |
|---|---|---|---|---|
| 4,887,530 A | * | 12/1989 | Sainio | 101/181 |
| 4,972,774 A | * | 11/1990 | MacPhee | 101/450.1 |
| 5,113,252 A | * | 5/1992 | Horie et al. | 358/528 |
| 5,224,640 A | * | 7/1993 | Fokos et al. | 266/27 |
| 5,295,236 A | * | 3/1994 | Bjorge et al. | 715/527 |
| 5,365,847 A | * | 11/1994 | Pers | 101/248 |
| 5,715,498 A | * | 2/1998 | Takeuchi et al. | 399/40 |
| 5,806,430 A | * | 9/1998 | Rodi | 101/484 |
| 5,819,655 A | * | 10/1998 | Dellivenneri et al. | 101/211 |
| 6,008,826 A | * | 12/1999 | Foote et al. | 347/116 |
| 6,118,463 A | * | 9/2000 | Houki et al. | 347/116 |
| 6,327,453 B1 | * | 12/2001 | Imaizumi et al. | 399/301 |
| 6,380,960 B1 | * | 4/2002 | Shinohara | 347/116 |

* cited by examiner

*Primary Examiner*—Andrew H. Hirschfeld
*Assistant Examiner*—Wasseem H. Hamdan
(74) *Attorney, Agent, or Firm*—Katten Muchin Zavis Rosenman

(57) ABSTRACT

There are disclosed methods and systems for the process of on-press plate imaging, including automatic processes for plate preparation, that compensate for registration and print-length errors (plate loading is performed before imaging). As a result of these processes, the position accuracy is determined by the imaging system. The system of the present invention creates deformed images on the plates during the imaging stage, these deformed images, being such that the separations will be in register (coordinated) after printing.

4 Claims, 5 Drawing Sheets

DIGITAL OFFSET PRINTING REGISTRATION

CROSS REFERENCES TO RELATED APPLICATIONS

This patent application claims priority from and is related to U.S. Provisional Patent Application Ser. No. 60/157,856, entitled DIGITAL OFFSET PRINTING REGISTRATION, filed on Oct. 6, 1999, this Provisional Patent Application incorporated by reference in its entirety herein.

BACKGROUND OF THE INVENTION

The present invention is directed to lithography, and in particular, to compensating for deformities in color separations by imaging correspondingly deformed images on printing plates, such that these plates will print the color separations in register.

Conventional lithography processes typically replicate images by transferring ink from a previously prepared plate onto a substrate, typically paper. In offset printing, this transfer is done indirectly by a soft blanket that is stamped by the plate. This soft blanket then impresses this image onto paper.

Color images are obtained by separating the image into four color process plates, these four colors corresponding to Cyan, Magenta, Yellow and Black, commonly known as "CMYK", that are then combined on paper. If an image is to be accurately represented, all four color separations must have the same length, scale and position when impressed on the paper. However, this is difficult, as there may be misalignment and scale errors, these errors being classified as either fixed errors or paper errors.

Fixed errors are errors in misalignment and scale that do not change from image to image. These errors are typically caused by tolerances of the prepress imaging devices, errors produced during development of the imaged plates, errors in mounting the plates on the printing press cylinders, and errors of the printing press mechanisms. Errors of the printing press mechanisms typically include plate cylinders having lost their roundness from wear or the like, and loosening of gears, bearings, etc., typically from wear over time.

Paper errors typically result from paper wetting by fountain solution and ink, and by forces applied on the paper by the printing press, that tend to deform the paper. With the paper deformed, data is printed at undesired or unintended locations. Even when the deformation forces on the paper are released, the paper does not usually recover to its original configuration, and thus, there is a difference between the data (on the imaged printing plate) and the resultant printed image.

Paper deformation effects, that result in paper errors, are explained by FIGS. 1A–1C Specifically, FIG. 1A shows the desired or ideal situation where a rectangular image 20, formed of lines 20a and 20b, is to be imposed on the substrate 22, typically paper. In FIG. 1B, the paper 22 has been impressed with a first separation, here a black (K of the CMYK) impression 24. This impression 24 is trapezoidal in shape (formed of lines 24a, 24b) as a result of the paper deformation in the press. Subsequently, in FIG. 1C, a second separation, for example a Cyan or "C" separation is impressed onto this deformed paper 22, as represented by broken line 26, in a misregistration. Similarly in this manner, the subsequent Yellow "Y" and Magenta "M" separations will also be misregstered in accordance with the paper deformation.

In conventional press systems, some of the misregstration caused by the fixed errors was correctable mechanically by the operator after reviewing the initially printed sheets. In this case, the operator manually adjusted the relative positions of the printing plates or changed pressure on the printed substrate.

These manual, operator-made adjustments have drawbacks. Initially, these adjustments are time consuming and require considerable operator skill. Additionally, the adjustments of plate cylinders required expensive mechanical devices. Even in conventional presses, although the time required for adjustment is lessened, the adjustment machinery is more complex and more expensive.

A few presses have been designed such that printing plates are imaged on the press, or "on-press", whereby the plates are not removed from the press for imaging. One exemplary press is the Model 74 KARAT offset digital press, manufactured by a Karat Digital Press of Herzlia, Israel in a joint venture with KBA (Koenig & Bauer Aktlengesellschaft). This design, besides reducing the make ready or preparation time, allows elimination of most of the registration fixed errors. However, paper errors remain and to date, a procedure does not exist for correcting misregistration caused by paper errors.

SUMMARY OF THE INVENTION

The present invention improves the process of on-press printing member, typically printing plate, imaging, as it provides an automatic process for plate preparation that compensates for registration and print-length errors (plate loading is performed before imaging and therefore the position accuracy is determined by the imaging system). The system of the present invention creates deformed images on the printing members, typically plates, during the imaging stage, these deformed images, being such that the separations will be in register (coordinated) after printing.

The present invention automatically determines the exact position for each data pixel within the distorted image to be placed onto the plates. This position is a sum of fixed errors and errors associated with stretch of the substrate, typically paper. The invention also provides an automatic procedure for predicting paper stretch errors.

The correction process uses the image as a measure of the distribution of the ink load and a set of fixed parameters (determined by the paper, ink and other press conditions) to solve a differential equation that calculates the errors associated with the paper stretch. These errors are added to the fixed-errors map to obtain the final errors. The final pixel-location map is deduced by inverting the process, namely finding the position of a pixel such as when the position error is added to the position set, the requested position on print will be obtained. The resulting map is implemented, in conjunction with a "strobe" timing card and/or data manipulation card, to create the distorted plate image, resulting in a printing plate being imaged such that misregistration of the separations forming the printed image on the substrate are minimized or eliminated altogether.

BRIEF DESCRIPTION OF THE DRAWINGS

The present invention will be described with reference to the accompanying drawings, wherein like reference numerals or characters identify corresponding or like components. In the drawings.

DETAILED DESCRIPTION OF THE INVENTION

The present invention is operable with printing presses, typically digital offset printing presses. For example, one such digital printing press, that uses printing plates is commercially available as the Quickmaster D1, from Heidelberg Druckmaschinen AG of Germany. The present invention utilizes digital offset printing deformation that is performed during the stage of imaging the printing plates and/or cylinders.

The present invention utilizes a microprocessor or other computing device to automatically obtain relevant information as to the amount of paper distortion induced by the ink-load distribution in the image to be printed, and then employs a strobe/data manipulation system, such as detailed below.

Figure 1C:
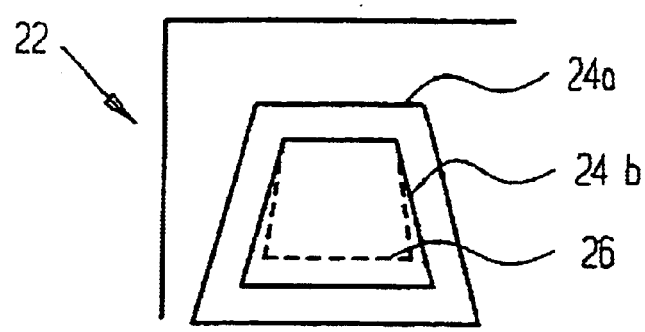
FIGS. 1A–1C are diagrams useful in explaining problems associated with the prior art.
Figure 1B:
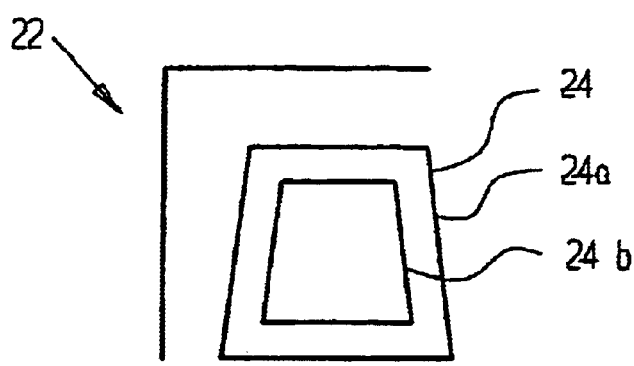
Figure 1A:
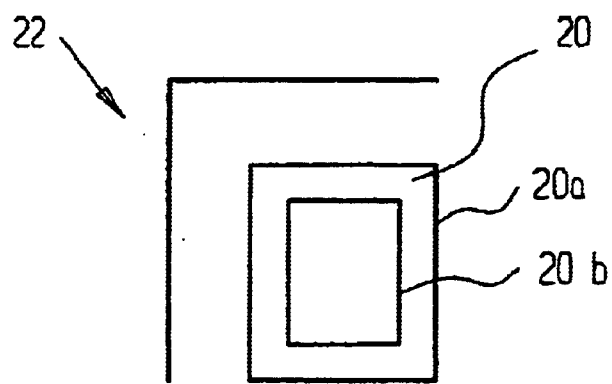
Figure 2:
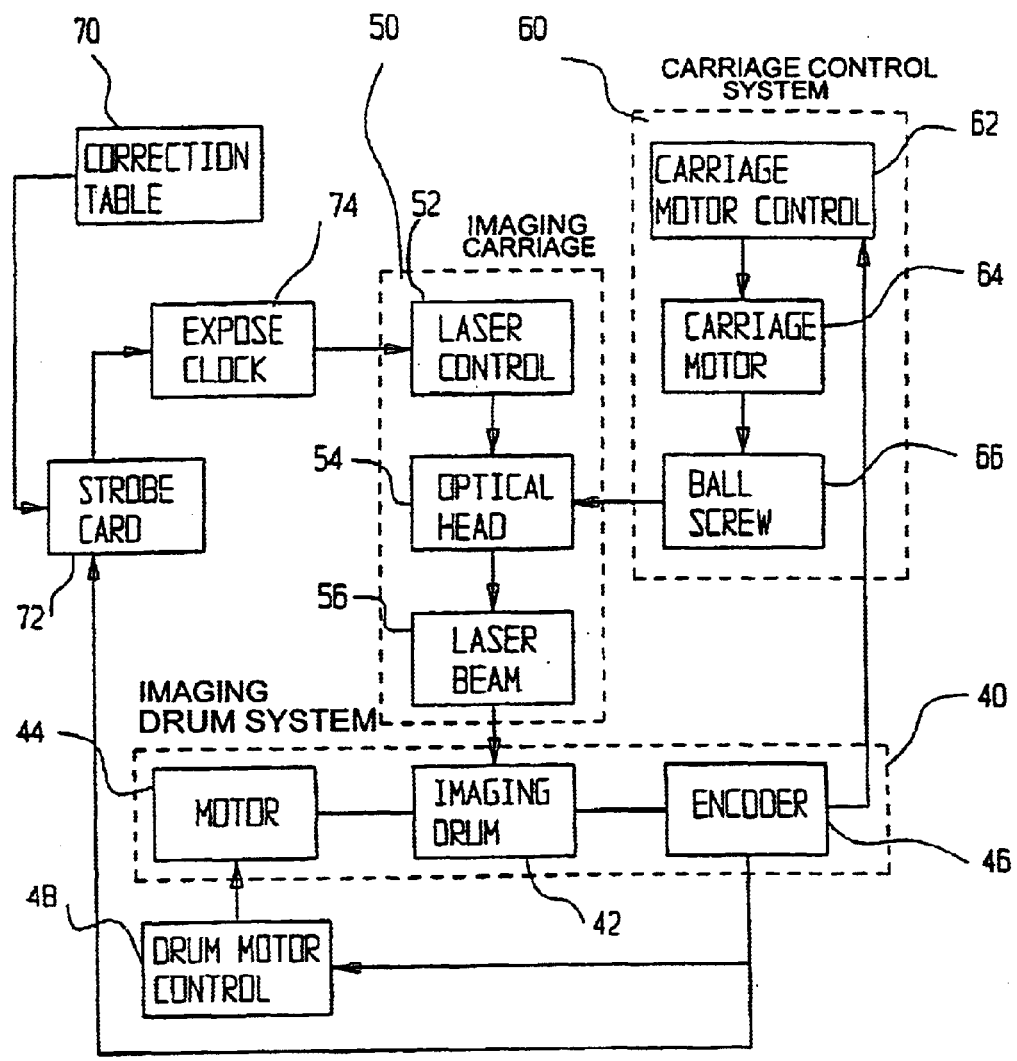
FIG. 2 is a schematic diagram of the imaging head and the strobe card and associated systems in accordance with an embodiment of the present invention.

Turning to FIG. 2, there is shown an exemplary imaging drum system 40. The system 40 includes an imaging drum 42, rotated via a shaft (not shown) by a motor 44, that is controlled by drum motor control 48. An encoder 46 is coupled to the drum shaft, for supplying digital data to the carriage control system 60, to the drum motor control 48 and to the strobe card 72. An imaging carriage 50, controlled by the carriage control system 60, is formed of a laser control card 52, and an optical head 54 which produces a high intensity laser beam 56 directed onto the imaging drum 42.

Carriage control system 60 is used to move the imaging carriage 50 along the drum 42. The carriage system 60 comprise a carnage motor control 62, carriage motor 64 and typically a ball screw 66, which translates the rotational movement of motor 64 into translational movement along the drum 42. Strobe card 72 locks on the frequency of the encoder signal 46, and generates a high frequency expose clock 74, that is in phase with the rotation of the drum 42.

In normal operation, the ratio between the high frequency signal and the encoder signal 46 is kept constant. Also, the strobe card 72 is such that it can be preloaded with data from correction table 70. Data in the correction table 70 (typically in a data manipulation card) is such that minor modifications of the ratio between the high frequency signal and the encoder signal are made easily.

As a result of this modification the data can be expanded by slowing down the expose clock 74, or compressed by raising the expose clock 74. By extending and compressing the data, corrections of the image plates is achieved in order to minimize and eliminate any misregistration of the color separations in a printed image. This is because the strobe card 72 and data correction table are such that they can change the rate of imaging, while the speed of the imaging drum 42 and the speed of the carriage 50 are synchronized and kept constant.

Figure 3:
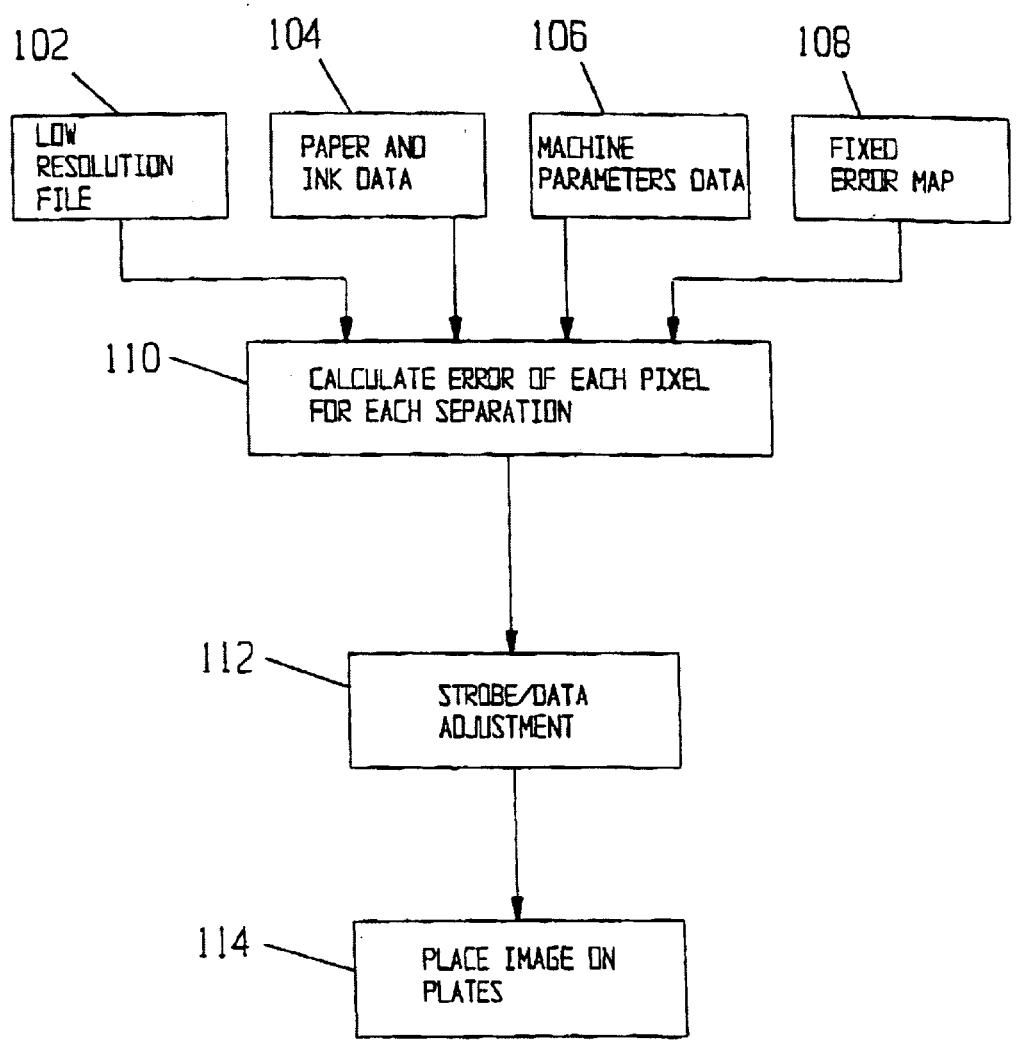
FIG. 3 is a flow chart detailing an embodiment of the present invention.

FIG. 3 shows a flow diagram of the automatic correction scheme of the present invention. Initially, the image itself is typically in the form of a low resolution file, at block 102. Data as to the substrate and ink to be used, typically from a stored data base, is at block 104, and press parameters, such as speed, impression pressure, ink temperatures are at block 106. A fixed error map, at block 108, and parameters for the process, block 110, form other elements for performing the present invention.

The low-resolution file, block 102, typically has a resolution of 1 dot per millimeter, and as such, is accurate enough for error evaluation. The low-resolution file may employ resolutions as great as 10 dots per millimeter.

One example of a low-resolution file is prepared by InkPro™, available from Scitex Corporation of Herzelia, Israel. Turning now to the process 110, it is designed to calculate the error of each pixel, at the low resolution image, for each separation (typically separations 1–4, corresponding to CMYK, respectively), with respect to a first reference separation.

The process is directed to the relation between the errors and the image, where, $u^i(x,y)$ is defined as the misregister in the x-direction of the separation i at a point (x,y) on the paper. Here x is the drum perimeter axis, y is the carriage screw axis. Only the x-component of the misregister is of interest here, since it is usually much larger than that along the y direction. The magnitude of $u^i(x,y)$ depends on (x,y) and i. This dependence is determined by the ink load on paper $f^i(x,y)$ of previous separations $j \leq i$. The ink load plays the role of an error source in the equation describing the magnitude of the misregister. When calculating the ink load function, dot gain and the non-linear response of the paper on ink load must be taken into account by passing each image dot-area through a 1-D-LUT (look up table) correction.

Figure 5:
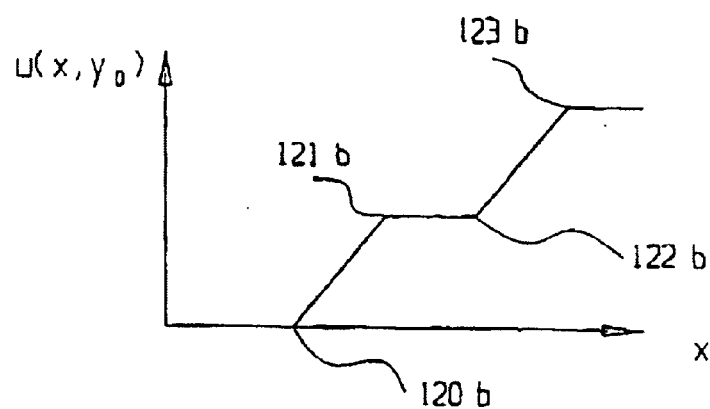
FIG. 5 is a plot of the registration error along the X-axis, in accordance with the printed pattern of FIG. 4.
Figure 4:
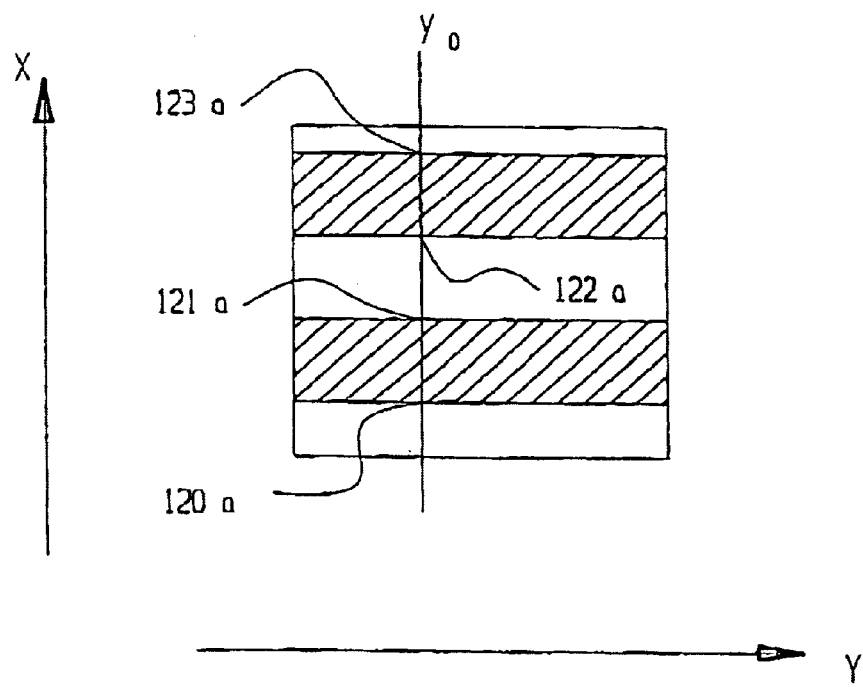
FIG. 4 is a diagram of a printed pattern where the ink load is uniform along the Y-axis.

The process is based on experiments showing the following behavior. Initially, a pattern was printed, that was uniform along the Y-axis (FIG. 4). Points 120a, 121a, 122a and 123a designate borders of the ink area. Specifically, where the ink-load changes along the X-axis, the errors of the different separations were found to be proportional to the integral ink load, as plotted in FIG. 5, where points 120b, 121b, 122b and 123b designate the ink borders corresponding to the points of FIG. 4.

Figure 7:
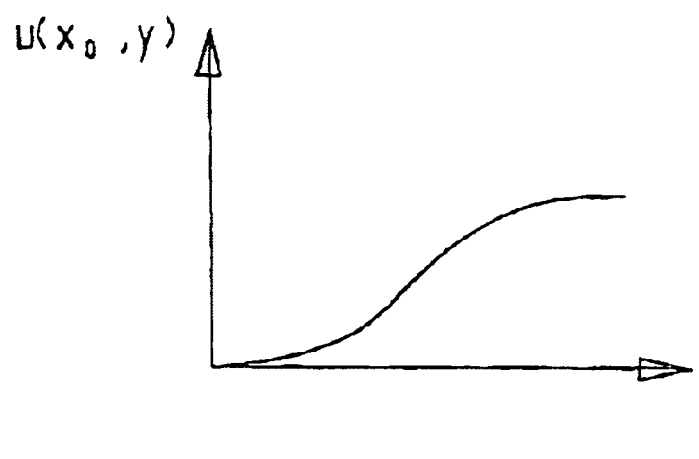
FIG. 7 is a plot of the registration error along the Y-axis, in accordance with the printed pattern of FIG. 6.
Figure 6:
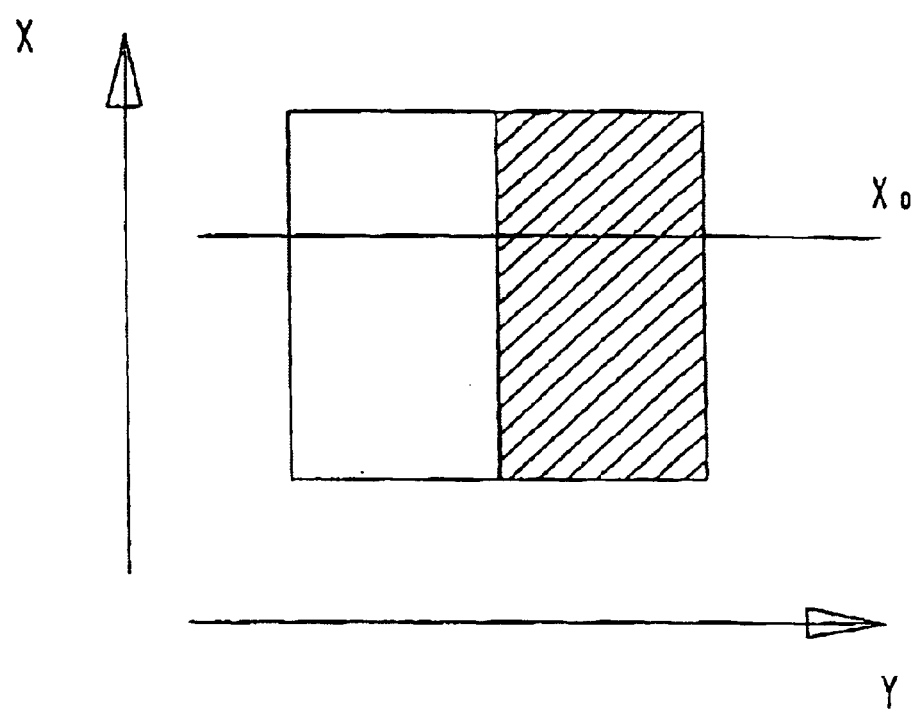
FIG. 6 is a diagram of a printed pattern where the ink load is uniform along the X-axis.

When a pattern was printed that was uniform along the X-axis (FIG. 6), namely, where the ink-load changes along the Y-axis, the errors of the different separations were found to behave as plotted in FIG. 7.

This behavior is similar to that of a heat equation with source $g_i(x,y)$, known in the art, which led to the assumption that the errors $u^i(x,y)$ follow a diffusion equation:

$$\frac{\partial}{\partial x} u^i(x,y) = -D \frac{\partial^2}{\partial y^2} u^i(x,y) + g_i(x,y)$$

Where D is the diffusion constant. It can be seen, that when the ink-load $g_i(x,y)$ does not change with y, namely $g_i(x,y) = g_i(x)$, we obtain as a solution an integral ($\partial^2/\partial y^2$ drops out), thus: $\partial u/\partial x = g_i(x)$. Hence, $$u_i(x) = \int_U^Y g_i(x') dx'$$

When y dependence is inserted, a "heat diffusion" process occurs that causes an error in the inked side of the paper to "spill" over into the clear areas.

When calculating the errors, each separation error is affected by the previously printed separations, according to the principle outlined above. Therefore:

$$g_i(x, y) = \sum_{i \in j} A_{ij} f'(x, y)$$

When solving the equations, a constant matrix is used to describe the additive effect, e.g., the error in separation 4 equals the sum of errors in separations 1 to 3. Note that the ink load functions f'(x,y) are derived from the CMYK file values by transforming it thorough a 1-D LUT that takes into account the dot gain and a correction for the non-linear response of the misregister on the ink coverage on paper.

The final equation using a vector notation is:

$$\frac{\partial}{\partial x}[\bar{u}(x, y)] = -D\frac{\partial^2}{\partial y^2}[\bar{u}(x, y)] + \{A_{ij}\}[\bar{f}(x, y)] + [\bar{f}(x, y)]\{B_{ij}\}[\bar{f}(x, y)]$$

Here, u=($u^K$, $u^C$, $u^M$, $u^Y$) is the errors four-vector, and f=($f^K$, $f^C$, $f^M$, $f^Y$) is the image four-separation data (taking into account the 1-D-LUT correction). Aij is he matrix, discussed above, describing the relation between the registration errors and the ink load, D is the diffusion parameter and Bij is a matrix describing second order corrections, taking into account interaction effects, related to ink-over-ink areas. In most cases, these corrections are small, and therefore Bij can typically be set Bij=0 for all i,j. The parameters Aij, Bij and D are dependent on paper, ink, and machine parameters. To determine them, a calibration process is done, and the values of the parameters are saved in a database for future use.

The calibration process involves imaging and printing of "synthetic" files for a certain set of ink, paper and machine parameters. The parameters Aij. Bij and D are adjusted until the measured errors are identical (or within a small margin) to those predicted by the model.

A careful design of the "synthetic" files allows for faster and easier calibration, by determining some of the parameters independently from the others. For example, the use of a full format, one separation uniform coverage simplifies the equation by removing the y-dependence, and the second-order interaction terms. Thus, it allows an easy determination of some of the Aij's. Repeating the process with another separation will give other Aij's until all of them are obtained. Then, the parameter D and the Bij can be determined by using more complex files.

To obtain the fixed error map, the following procedure is applied. Fixed errors are mapped on the plate surface, by imaging and printing the same grid for all separations, and then measuring the relative shifts with respect to the first separation on each point of the grid, to produce the fixed-errors map. The fixed-errors map is saved in memory, prior to imaging.

During operation, the user defines the printing variables before starting imaging the next job. The parameters, defined during the calibration stage, are recalled from the database and loaded into the algorithm or program of the process. The low-resolution file is loaded into an array, and the differential equation is transformed into a difference scheme and solved numerically. The results give a good estimate of the paper stretch errors, associated with the ink load.

When calculating the final errors, an interpolated fixed error map is added to the image dependent errors to obtain the total error magnitude as a function of position. The interpolation is required because the typical resolution of the measured error map is about 0.1 dots per millimeter, while the image dependent errors are calculated on a 1 dot per millimeter grid. After the total number of errors is known, the strobe/data system is optimized, as the strobe "timing" card 72 and/or data manipulation card adjusts, expands or compresses (as detailed above) the resultant image by controlling the rate of imaging (typically by controlling the laser beam 56 as detailed above), at block 112 (FIG. 3). In this way, the residual errors after correction are minimal. The image, now "distorted" by above detailed process, is then placed onto printing members, typically plates, or other substrates, at block 114 (FIG. 3).

The process is completely transparent to the user (and does not require operator intervention, except for the initial error mapping and paper/ink calibration setup). It does not require expensive mechanical apparatus, since the correction is distribution of done by a software/electronic hardware setting.

Although the preferred embodiment of the present invention has been described in terms of digital offset printing, the method is applicable to all printing technologies, since it connects the geometrical errors to the image printed. In particular, the technique is applicable to prepress imaging machines, provided the ink-paper calibration data is available.

The methods and apparatus disclosed herein have been described without reference to specific hardware of software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

It will further be appreciated by persons skilled in the art that the methods disclosed herein may be implemented by software or software means (data) executable on computing means, such as a CPU, PC, or other similar data processors, microprocessor, embedded processors, microcomputers, microcontrollers, etc. The computing means processes the inputted data from apparatus in communication therewith to calculate a desired result. Processing includes performing operations, preferably in the form of programs or algorithms (as detailed above) for performing the detailed methods of the present invention.

While preferred embodiments of the present invention have been described, so as to enable one of skill in the art to practice the present invention, the preceding description is intended to be exemplary only. It should not be used to limit the scope of the invention, which should be determined by reference to the following claims.

What is claimed is:

1. A method for eliminating printing registration errors in a system comprising a processor for computing distortion parameters and an imaging system in communication with said processor and configured for exposing distorted images, comprising the steps of:

receiving input data including paper data, at least one machine parameter and ink distribution data;

calculating image dependent errors from said input data;

receiving at least one fixed error map dependent on machine parameters and obtained during a calibration run;

predicting registration errors based on the fixed error map and said image dependent errors; and computing distortion parameters based on said registration errors for creating distorted images.

2. The method of claim 1, additionally comprising:
providing a printing member; and
placing said distorted image onto said printing member.

3. The method of claim 1, wherein said step of computing includes providing a reference image, calculating errors for substantially all of the pixels for at least one color separation in said reference image, and utilizing at least one of strobe data or data manipulation card in combination with said calculated errors to control the rate of imaging to created a distorted image.

4. The method of claim 3, wherein said step of providing a reference image includes providing said reference image in a low resolution file.

* * * * *